United States Patent [19]

Tawfik

[11] 4,096,989
[45] Jun. 27, 1978

[54] MONITORING APPARATUS FOR REDUNDANT CONTROL SYSTEMS

[75] Inventor: David A. Tawfik, Fort Lee, N.J.
[73] Assignee: The Bendix Corporation, Southfield, Mich.
[21] Appl. No.: 807,935
[22] Filed: Jun. 20, 1977
[51] Int. Cl.² .......................................... G06F 11/00
[52] U.S. Cl. .................................. 235/307; 318/563; 364/119
[58] Field of Search ................ 235/307, 304; 364/119; 318/563, 564; 340/146.1 BE

[56] References Cited

U.S. PATENT DOCUMENTS

| | | | |
|---|---|---|---|
| 3,476,922 | 11/1969 | Yiotis | 235/307 |
| 3,639,778 | 2/1972 | Careghino et al. | 235/307 |
| 3,805,235 | 4/1974 | Foster et al. | 235/307 |
| 3,882,406 | 5/1975 | Graves et al. | 235/307 |
| 4,032,757 | 6/1977 | Eccles | 364/119 |

*Primary Examiner*—Charles E. Atkinson
*Attorney, Agent, or Firm*—Anthony F. Cuoco

[57] ABSTRACT

Monitoring apparatus for redundant control systems includes means for preventing the monitoring apparatus from failing to a "good" state. Each of the channels in the redundant system generates a command signal which is compared to a signal provided by adding the command signal generated by another of the channels to a tracer signal. The amplitude of the addition signal is such so that the comparator toggles between its "good" and "fail" states to obviate failure of the monitoring apparatus to its "good" state.

8 Claims, 8 Drawing Figures

MONITORING APPARATUS FOR REDUNDANT CONTROL SYSTEMS

BACKGROUND OF THE INVENTION

1. Field of the Invention

This invention relates generally to redundant control systems and particularly to redundant control systems including monitoring apparatus. More particularly, this invention relates to means for preventing the monitoring apparatus from failing to a "good" state.

2. Description of the Prior Art

Control systems such as may be used for controlling the flight of an aircraft and described in commonly assigned copending U.S. application Ser. No. 802,685 filed June 2, 1977 by David A Tawfik, et al., are at least dual redundant and include monitoring apparatus for purposes of cross-monitoring the redundant channels in the system. A basic problem exists in that the monitoring apparatus must be prevented from failing to a "good" state. That is to say, the condition whereby the monitoring apparatus is unable to detect a system failure and only sees the system as "good" must be prevented. The present invention accomplished this simply and without the need for excessive hardware as has otherwise been the case.

SUMMARY OF THE INVENTION

This invention contemplates monitoring apparatus for redundant control systems including means for preventing the monitoring apparatus from failing to a "good" state. Each of the redundant channels of the control system is linked to another of the channels, whereby command signals and tracer signals generated by the channels are added to provide addition signals. The addition signal from one channel is applied to a comparator in another channel and compared thereby with the command signal from the other channel. The amplitude of the addition signals is twice the amplitude of the threshold of the comparators to insure that the comparators trip fifty percent of the time and toggle at a 50 percent duty cycle between their "good" and "fail" states. Dual decoders demodulate the comparator toggle outputs to drive system failure logic. Significantly, each of the channels is monitored by a signal (an addition signal) which is generated external to the channel and at a frequency other than the frequency of the addition signal generated by the channel to preclude the channel from being influenced by its own internally generated failures.

The main object of this invention is to provide means for preventing monitoring apparatus for redundant control systems from failing to a "good" state.

Another object of this invention is to provide means of the type described, wherein each redundant system channel includes a comparator which is responsive to added command and tracer signals to insure that the comparator trips 50 percent of the time and its output toggles at a 50 percent duty cycle between its "good" and "fail" states.

Another object of this invention is to generate the addition signals for toggling the comparators external to the comparator channel and at a frequency other than the frequency of the addition signal generated by the channel to preclude the comparator from being influenced by its own channel failures.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE INVENTION

The apparatus to be herein described is applicable to both digital and analog control systems that are at least dual redundant. For purposes of illustrating the invention the description to follow will be with reference to a dual processor digital control system such as disclosed and claimed in the aforenoted commonly assigned copending U.S. application.

The aforenoted copending U.S. application describes a dual processor/memory arrangement for inner and outer loop guidance of an aircraft and for cross processor monitoring during cruise and during critical flight maneuvers such as landing and the like. The memory means associated with each of the processors includes inner and outer loop memory devices for providing appropriate aircraft guidance command signals and a comparator memory device for accomplishing the aforenoted cross processor monitoring.

Figure 1:
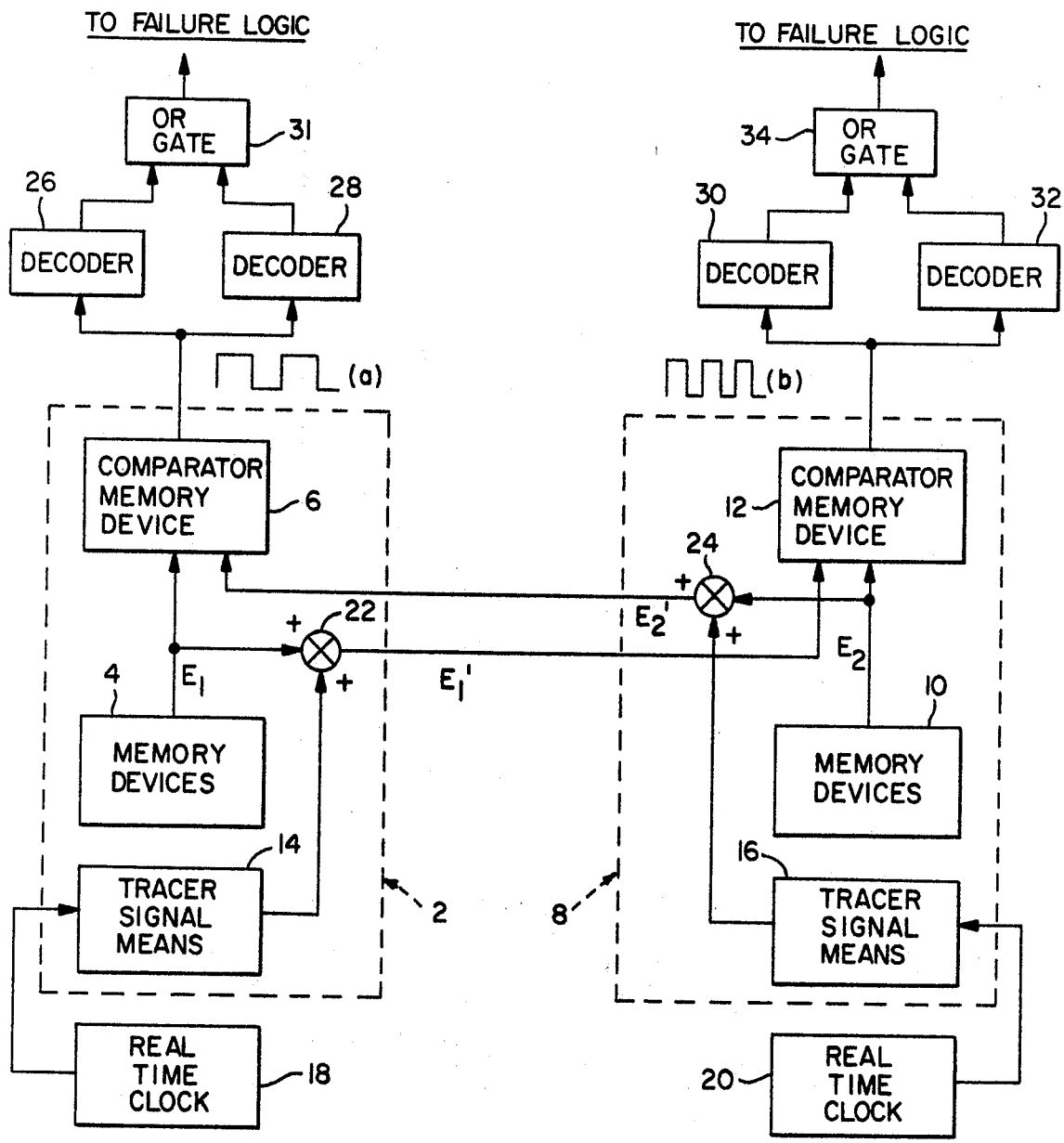
FIG. 1 is a block diagram showing monitoring apparatus in a dual channel structural arrangement according to the invention.

In accordance with the above and with reference to FIG. 1, processor/memory means designated by the numeral 2 includes appropriate inner loop and outer loop memory devices designated generally by the numeral 4 and a comparator memory device 6, while processor/memory means designated by the numeral 8 includes appropriate inner and outer loop memory devices designated generally by the numeral 10 and a comparator memory device 12. Reference is made to the aforenoted copending U.S. application for the particular structural arrangement of the inner and outer loop comparator memory devices. Additionally, processor/memory means 2 includes a tracer signal means 14 and processor/memory means 8 includes a tracer signal means 16, the purpose of which tracer signal means 14 and 16 will be hereinafter described.

Figure 4:
FIG. 4 is a graphical representation showing a waveform of a real time clock signal utilized by the invention.
Figure 5:
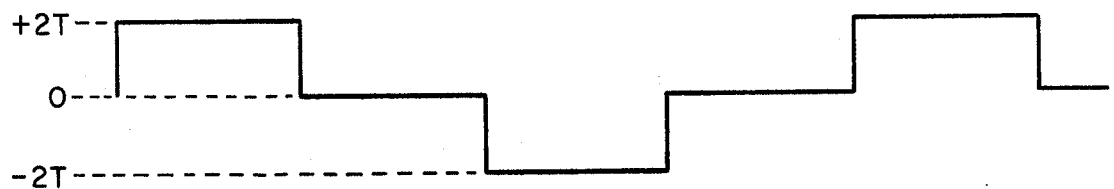
FIG. 5 is a graphical illustration showing the waveform of a tracer signal at a predetermined frequency generated from the real time clock signal as shown in FIG. 4.
Figure 7:
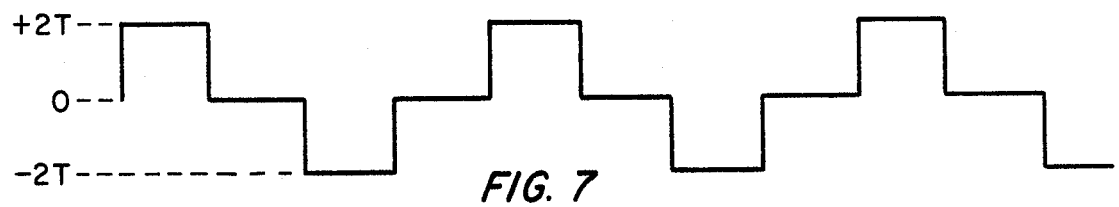
FIG. 7 is a graphical illustration showing the waveform of another tracer signal at another predetermined frequency generated from the real time clock signal shown in FIG. 4.

With continued reference to FIG. 1, real time clocks 18 and 20 generate alternating signals having a waveform as shown in FIG. 4. The signal generated by real time clock 18 is applied to tracer signal means 14 in processor/memory means 2, which provides a signal at a predetermined frequency and having a waveform as shown in FIG. 5. The signal from real time clock 20 is applied to tracer signal means 16 in processor/memory means 8, which provides a signal at another predetermined frequency as shown in FIG. 7, and which frequency is, for illustrative purposes, higher than the frequency of the signal generated by tracer signal means 14 as will be seen by comparing the waveforms of FIGS. 5 and 7.

Figure 6:
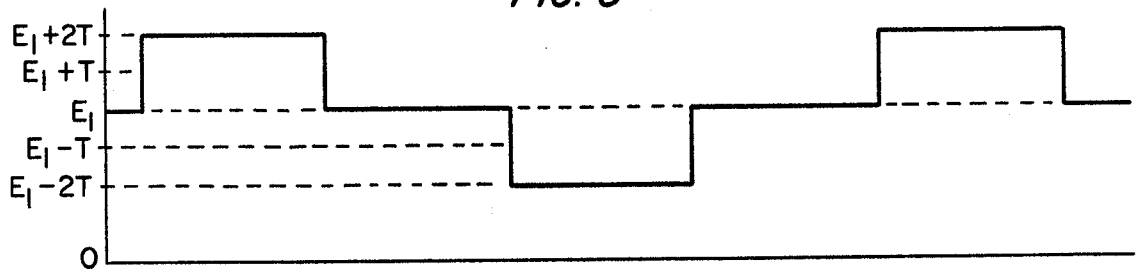
FIG. 6 is a graphical representation showing the waveform of a signal generated by adding the command signal having a waveform as shown in FIG. 2 and the tracer signal having a waveform as shown in FIG. 5, and which addition signal is used to monitor one of the dual channels shown in FIG. 1.

The signal from tracer signal means 14 is applied to adding means 22 in processor/memory means 2 and added thereby to the aircraft guidance command signal generated by memory devices 4, and which command signal is designated as $E_1$ and has a waveform as shown in FIG. 1. Adding means 22 provides a signal designated as $E_1'$, and which signal has a waveform as shown in FIG. 6. It will be noted that the waveform of signal $E_1'$ is the same as the waveform of the signal from tracer signal means 14, except that signal $E_1'$ is displaced from zero by the amplitude of signal $E_1$ due to the addition of signal $E_1$ and the signal from tracer signal means 14, as will be seen by comparing the waveforms of FIGS. 2, 5 and 6.

Figure 2:
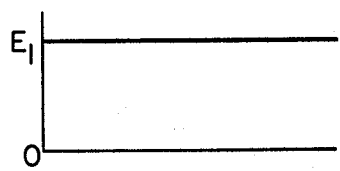
FIGS. 2 and 3 are graphical illustrations showing waveforms of first and second command signals provided by a dual channel control system with which the invention may be used.
Figure 3:
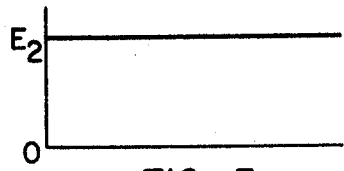
Figure 8:
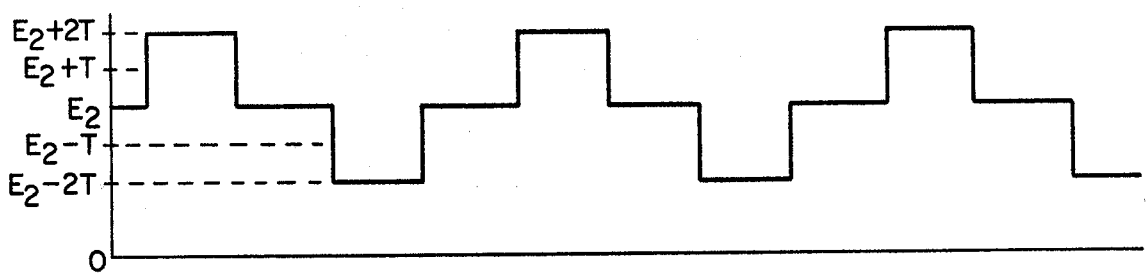
FIG. 8 is a graphical representation showing the waveform of a signal generated by adding the command signal having a waveform as shown in FIG. 3 and the tracer signal having a waveform as shown in FIG. 7, and which addition signal is used to monitor the other of the dual channels shown in FIG. 1.

Likewise, the signal from tracer signal means 16 is applied to an adding means 24 in processor/memory means 8 and added thereby to the aircraft guidance command signal generated by memory devices 10, and which command signal is designated as $E_2$ and has a waveform as shown in FIG. 2. Adding means 24 provides a signal designated as $E_2'$ and which signal has a waveform as shown in FIG. 8. It will be noted that the waveform of signal $E_2'$ is the same as the waveform of the signal from tracer signal means 16, except that signal $E_2'$ is displaced from zero by the amplitude of signal $E_2$ due to the addition of signal $E_2$ and the signal from tracer signal means 16, as will be seen by comparing the waveforms of FIGS. 3, 7 and 8.

Signal $E_1$ from memory devices 4 and signal $E_2'$ from signal adding means 24 are applied to comparator memory device 6 in processor/memory means 2 and compared thereby. The output of comparator memory device 6 is a toggle output having a waveform at a predetermined frequency and designated as (a) in FIG. 1.

Signal $E_2$ from memory device 10 and signal $E_1'$ from signal adding means 22 are applied to comparator memory device 12 in processor/memory means 8 and compared thereby. The output of comparator memory device 12 is a toggle output having a waveform at another predetermined frequency and designated as (b) in FIG. 1. It will be noted that the frequency of toggle output (b) is shown as being greater than the frequency of toggle output (a) for purposes which will hereinafter become evident.

The toggle output from comparator memory device 6 is applied to a dual decoder arrangement including decoders 26 and 28. The outputs from decoders 26 and 28 are applied to an OR Gate 30 which provides an appropriate failure logic output as is well known in the art.

The output from comparator memory device 12 is applied to a dual decoder arrangement including decoders 31 and 32, which are similar to decoders 26 and 28. The outputs from decoders 31 and 32 are applied to an OR Gate 34, which likewise provides an appropriate failure logic output.

OPERATION OF THE INVENTION

From the aforegoing description of the invention it will be seen that command signals $E_1$ and $E_2$ provided by processor/memory means 2 and 8, respectively, are added to the tracer signals from tracer signal means 14 and 16, respectively, and the addition signals are interchanged between the processor/memory means. Thus the comparator memory device in each of the processor/memory means sees a monitoring signal (the addition signal) generated outside of its own signal channel and at a frequency other than the addition signal generated by said channel.

Each of the added signals has an amplitude equal to the amplitude of the command signal to which it is added, $\pm 2T$, where T is the threshold of the corresponding comparator memory device as may be seen from FIGS. 6 and 8. Thus, the signal from signal adding means 22 has an amplitude of $E_1 +$ or $-$ twice the threshold of comparator memory device 12 and the signal from signal adding means 24 has an amplitude of $E_2 +$ or $-$ twice the threshold of comparator memory device 6. This relationship insures that the comparators will be tripped fifty percent of the time and their outputs will toggle at a fifty percent duty cycle between the "good" and the "fail" states to provide toggle outputs (a) and (b) as shown in FIG. 1. The dual decoders associated with each of the processor/memory means demodulate the toggle outputs from the comparator memory devices and drive appropriate system failure logic as will now be understood by those skilled in the art.

The significance of comparator memory devices 6 and 12 toggling at a 50 percent duty cycle between the "good" and the "fail" states is best understood when it is considered that if a failure to a "good" state is experienced, the toggling of the comparators to the "fail" state will provide an indication of the actual state of the monitored system. That is to say, the continuous toggling back and forth between the "good" and "fail" states insures that the monitoring apparatus does not continuously fail to a "good" state. This feature of the invention is further enhanced by the fact that each of the comparators is toggled in response to an addition signal generated by a channel outside of the particular comparator channel, and which channel is at a frequency other than the frequency of the addition signal generated by the particular comparator channel. To this extent the invention provides a self test feature, whereby each of the channels in a redundant control system is monitored by one of the other channels.

Although a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. Monitoring apparatus for control systems including a plurality of redundant channels; comprising:
   each of the channels including means for generating a command signal, means for generating a tracer signal, means for combining the command signal and the tracer signal, and comparator means;
   the comparator means in one channel comparing the command signal generated by the command signal generating means in the one channel to the combined command signal and tracer signal from the combining means in one of the other channels, and providing an output which toggles between the "good" and "fail" states of the comparator means in the one channel; and
   means responsive to the toggle output for providing a failure logic output.

2. Apparatus as described in claim 1, wherein:
   the comparator means in the one channel having a predetermined threshold; and
   the combined signal from the one of the other channels having an amplitude which is twice said comparator means threshold for tripping the comparator means at a 50 percent duty cycle between its "good" and "fail" states.

3. Apparatus as described by claim 1, wherein:
   the combined signals from each of the channels are alternating signals; and
   each of the combined signals has a different frequency.

4. Apparatus as described by claim 1, wherein the means for combining the command signal and the tracer signal includes:
   means for adding the command signal and the tracer signal.

5. Apparatus as described by claim 2, wherein:
   the amplitude of the combined signal is twice said comparator threshold in one polarity and in the opposite polarity.

6. Apparatus as described by claim 1, wherein:
   the toggle outputs provided by the comparator means in each of the channels are of different frequencies.

7. Apparatus as described by claim 3, wherein:
   the tracer signals generated by each of the channels are alternating signals, each of which has a different frequency; and
   each of the combined signals has a frequency corresponding to the frequency of the tracer signal with which it is combined.

8. Apparatus as described by claim 1 wherein:
   the comparator output toggling between the "good" and the "fail" states insures that the monitoring apparatus does not continuously fail to a "good" state.

* * * * *